US006504158B2

(12) United States Patent
Possin

(10) Patent No.: US 6,504,158 B2
(45) Date of Patent: Jan. 7, 2003

(54) IMAGING ARRAY MINIMIZING LEAKAGE CURRENTS

(75) Inventor: George Edward Possin, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 51 days.

(21) Appl. No.: 09/729,124

(22) Filed: Dec. 4, 2000

(65) Prior Publication Data

US 2002/0066860 A1 Jun. 6, 2002

(51) Int. Cl.[7] ................................................ H01L 31/06
(52) U.S. Cl. ............................ 250/370.09; 250/370.01; 250/370.1; 348/307; 348/308
(58) Field of Search ....................... 250/370.09, 370.01, 250/370.1; 348/307, 308

(56) References Cited

U.S. PATENT DOCUMENTS

| 5,227,635 A | * | 7/1993 | Iwanczyk | 250/370.12 |
|---|---|---|---|---|
| 5,237,197 A | * | 8/1993 | Snoeys et al. | 257/458 |
| 5,434,417 A | * | 7/1995 | Nygren | 250/370.01 |
| 5,929,499 A | | 7/1999 | Kuhlmann et al. | 257/429 |

* cited by examiner

Primary Examiner—Constantine Hannaher
Assistant Examiner—Andrew Israel
(74) Attorney, Agent, or Firm—Donald S. Ingraham; Christian G. Cabou

(57) ABSTRACT

An imaging array of photodiodes on a chip cut from a semiconductor wafer includes a guard diode at each cut edge to reduce leakage current from the cut edges when the imaging array is in use. The photodiodes and guard diode may be fabricated from the same materials during the same process step. Electrical contacts coupled to the imaging array provide a mechanism for applying a reverse electrical bias to the photodiodes and guard region with respect to the wafer.

35 Claims, 4 Drawing Sheets

IMAGING ARRAY MINIMIZING LEAKAGE CURRENTS

BACKGROUND OF THE INVENTION

The present invention relates to imagers used to detect light or ionizing radiation. In particular, the present invention relates to imagers with imaging arrays designed to reduce image-degrading current.

Radiation imagers comprised of semiconductor diode arrays are commonly used to detect ionizing radiation. The semiconductor diode arrays can be arranged with scintillators to form detector pixels and are used for X-ray Computed Tomography (CT).

Leakage currents in imagers (e.g., X-ray imagers) can have a significant impact on noise and the stability of the dark offset. Leakage current is a source of additional noise and generates offsets which disadvantageously drift with temperature. The dark offset is the signal produced by the imaging array without any radiation. A value for the dark offset is stored and subtracted from the radiation signal data. Changes of the dark offset in time, due to, for example, ambient temperature changes or temperature changes in the imager during operation, are undesirable.

Although leakage currents from defects in the components of such imagers have dramatically decreased in recent years due to improved fabrication processes, leakage currents still result from at least four sources. The first source of leakage current results from cutting semiconductor chips with the imaging array thereon from semiconductor wafers. The cut edge is typically not well passivated, and hence tends to be a significant source of leakage current. The second source of leakage current occurs where adjacent pixel diodes of the array are maintained at very small bias voltages (i.e., less than 50 mV) and at slightly different reverse bias voltages, resulting in a bipolar current between adjacent light-sensitive imaging devices. This bipolar current is reduced to zero for larger reverse diode bias (i. e., much larger than 50 mV). The use of large (>>50 mV) reverse bias has two advantages in imaging applications. First, as described above, it can reduce one component of undesirable leakage current, which is a source of offset and offset thermal drift in imaging applications. Second, with reverse bias on the diode, and one terminal of the diode an open circuit, signal charge will produce a reduction of diode voltage. This charge can then be readout by connecting the diode to an amplifier using a switch device. This permits analog multiplexed readout of charge on multiple diodes in the array using a single amplifier. Such larger reverse diode bias, however, increases the other sources of leakage current. Hence many detector arrays are operated at near zero bias voltage In the present invention the diode bias is large (>>50 mV) to reduce the bipolar current. The third source of leakage is defects in the semiconductor material. The fourth source of leakage is defects at semiconductor/dielectric interfaces. All of these leakage sources can be increased by radiation damage, with the fourth source being especially sensitive to radiation. It is therefore also desirable that a radiation imager comprised of detector diode array have means for reducing the operational degradations caused by the effects of radiation.

SUMMARY OF THE INVENTION

The present invention provides, in a first aspect, an imaging apparatus. The imaging apparatus includes a substrate, at least one radiation-sensitive imaging region in the substrate, and a guard region at or immediately adjacent a cut edge of the substrate. The guard region reduces leakage current reaching the radiation-sensitive imaging region from the cut edge when the imaging apparatus is in use. The imaging region(s) and the guard region are electrically reverse biased with respect to the substrate.

The present invention provides, in a second aspect, an imager. The imager comprises a semiconductor substrate, a plurality of light-sensitive imaging regions in the semiconductor substrate, a guard region in the substrate at or immediately adjacent a cut edge of the substrate, and a plurality of electrical contacts for providing a reverse electrical bias to a plurality of light-sensitive imaging devices and a guard device, created, respectively, by the semiconductor substrate together with the plurality of light-sensitive imaging regions and the guard region.

The present invention provides, in third and fourth aspects, methods of fabricating imaging apparatus and imagers of the first and second aspects, respectively.

DETAILED DESCRIPTION OF THE INVENTION

Figure 1:
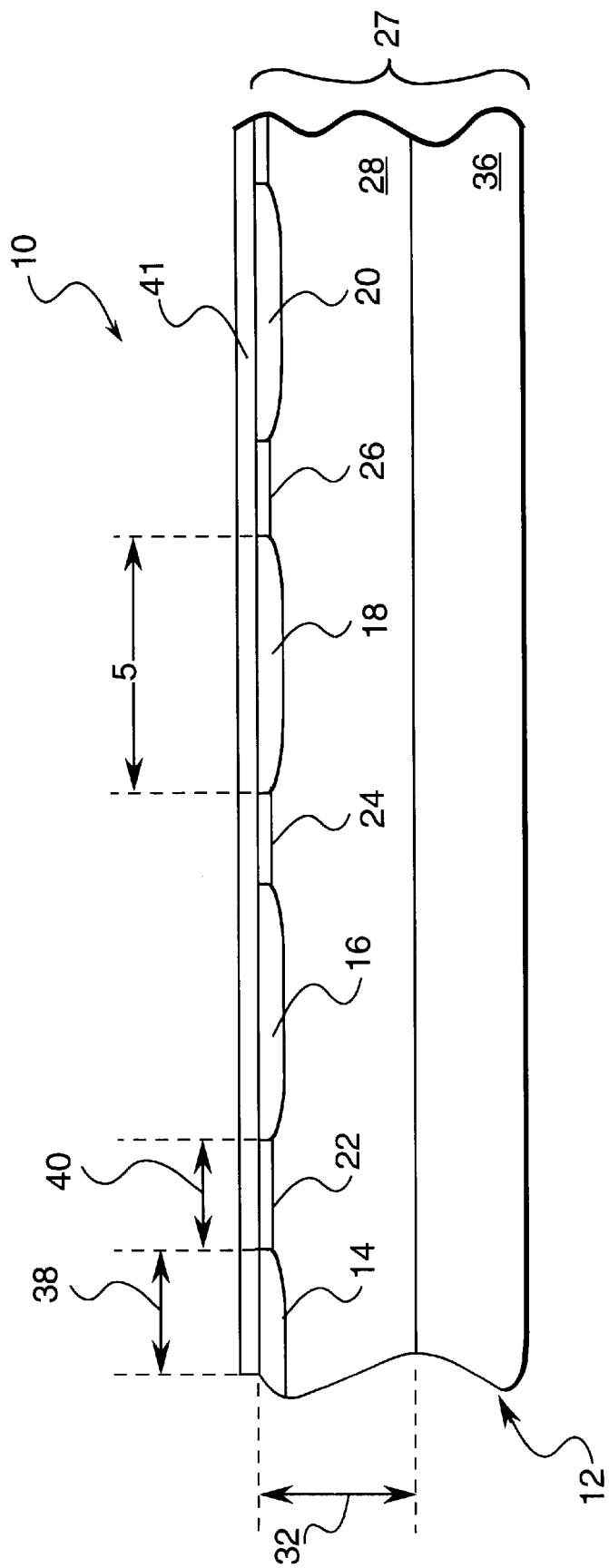
FIG. 1 is a cross-sectional view of a relevant section of an example imager of in accordance with the present invention.

FIG. 1 is a cross-sectional view of a relevant section 10 of a semiconductor chip (not shown) near an edge 12 thereof. The edge represents an area where the chip was cut from a larger semiconductor wafer. At or immediately adjacent edge 12 is a guard region 14 of a guard device. As used herein, "at or immediately adjacent to" refers to the disposition of the component such that there are not intervening array components disposed between the two referenced portions of the array. The function of the guard device is to reduce leakage current from cut edge 12 from reaching radiation-sensitive imaging devices closest thereto. A semiconductor substrate 27 comprising a lower layer 36 heavily doped compared to an upper layer 28, together with imaging regions, e.g., doped imaging regions 16, 18 and 20, provide a plurality radiation-sensitive imaging devices (in this example, 3 representative photodiodes are shown in the figures) corresponding to doped regions 16, 18, 20. Similarly, layers 36 and 28, together with guard region 14 create a radiation-sensitive guard device (in this example, also a photodiode). The region of the chip containing the imaging regions (i.e., regions 16, 18, 20) is referred to as the active region. In one example embodiment, the guard region (or multiple guard regions) extends along a lateral dimension of the active region.

In one example embodiment, semiconductor substrate 27 is doped to be of N conductivity type, with layer 36 being heavily doped compared to layer 28. Heavily doped in this context means dopant concentrations larger than about $10^{18} \#/cm^3$. Each of the imaging regions is of P+ conductivity type, doped with, for example, boron at a dopant concentration in excess of about $10^{18} \#/cm^3$ (the "#" nomenclature is used to refer to the population of the particular dopant type) and commonly having a resistivity in the range between about 0.05 and about 0.0001 ohm-cm. In this example, the guard region has a similar depth and the same doping type as the imaging regions. The photodiodes and the guard diode have, for example, a depth of about 0.25 microns to about 2 microns. The guard device preferably has a depth of about 1 micron to about 10 microns. However the electrical extent of the guard device can be increased by applying reverse bias causing the depletion region to extend substantially beyond the doped region. Depending on the doping level and bias the extent of the depletion region can be more than 20 microns.

Although described in the present example as diodes sensitive to visible light, it will be understood that the radiation-sensitive imaging devices and/or guard device could be sensitive to light of about 0.5 eV (i.e., infrared) to about 3 eV (i.e., ultra violet), X-rays, high-energy charged particles (higher than 1 kV), and gamma rays. Further, it will be understood that the guard device need not be exactly the same type of device as the radiation-sensitive imaging devices. For example, the dopant used for guard region 14 of the guard device could be a different chemical impurity than the dopant of the imaging regions, while still resulting in the same doping type (that is, n-type, p-type, etc.). As one example, instead of boron, antimony could be used or the dopant for the guard ring. Further, the semiconductor material in guard region 14 can be different from the semiconductor material surrounding the imaging regions. For example, silicon could be used for one and silicon-germanium alloy for the other.

Optionally, between adjacent imaging regions are reflecting regions 22, 24 and 26 comprising a moderately-doped semiconductor (as described below), doped to be of the opposite conductivity type from that of the imaging regions and, in this example, the guard region as well. For example, if the imaging regions were doped to be of P+ conductivity type, the reflecting regions would be doped to be of N− or N+ conductivity type, on the order of about $10^{12}$ to about $10^{17}$#/cm$^3$, to have a resistivity of about 0.01 to about 10 ohm-cm and be preferably as shallow as possible, for example, about 0.5 microns or less. A thermal oxide layer 41 is typically formed on the surface of semiconductor 27, and comprises, for example, silicon dioxide with a thickness of between about 0.05 microns and about 1.0 microns. The function of the moderately doped reflecting regions 22, 24, 26 is to reflect minority carriers from the top oxide/semiconductor interface, and suppress thermal generation of minority carriers, thereby reducing leakage current in the light-sensitive imaging devices. Optionally, some or all of the reflecting regions further comprise a doped N+ conductivity type portion (e.g., portion 502 in FIG. 5), having a dopant concentration on the order of about $10^{18}$#/cm$^3$ or higher. Such a relatively high doping concentration is desirable because it is more effective at reducing leakage currents and recombination at the reflecting regions. However, it is generally undesirable for such heavily doped N+ regions to extend within the depletion region of the imaging photodiodes. The lightly doped reflecting regions can extend into the depletion region of the imaging photodiodes. Both the guard and reflecting regions can extend within the guard diode depletion region. The typical extent of the depletion regions are between 10 and 100 microns.

Where amplifiers are used to read out the voltages of the radiation-sensitive imaging devices, the amplifiers typically apply a very small non-uniform voltage to the imaging devices. This non-uniformity is due to the fact that amplifiers (as with many devices) are not perfect. Therefore, adjacent imaging devices (e.g. diodes 14, 16, 18) may have slightly different voltages applied to them, potentially resulting in a bipolar current between adjacent imaging devices, if the voltages applied to both devices is small or comparable to kT/e~25 mV. A bipolar current may also be set up between the guard device and the closest radiation-sensitive imaging device, as the guard device is not coupled to an amplifier, while the imaging devices are coupled to amplifiers. The negative effects (e.g. noise) of such a bipolar current on image degradation can be of the same negative leakage current from the cut edge. To reduce the bipolar current, a substantial reverse bias (i.e., more than 100 mV) is applied to the guard device and radiation-sensitive imaging devices, relative to the substrate. However, reverse biasing also has the unwanted effect of increasing the other sources of leakage current in the light-sensitive imaging devices. The net leakage current may still be reduced by substantial reverse biasing. In addition, some applications require substantial reverse bias so that charge can be stored on the reverse biased imaging devices.

It will be understood that the reverse bias applied to the radiation-sensitive imaging devices need not be at the same magnitude as that for the guard device. The magnitude of optimum reverse bias will depend on the device design. For example, applying a relatively large reverse bias (e.g., >20 volts) to the guard device will result in a deeper and wider depletion region 42 (shown in phantom in FIG. 3), which improves the ability of the guard device to reduce leakage current from cut edge 12. Depletion regions are discussed in more detail below. However, a reverse bias of similar magnitude applied to a radiation-sensitive imaging device could result in undesirably large leakage currents.

Figure 2:
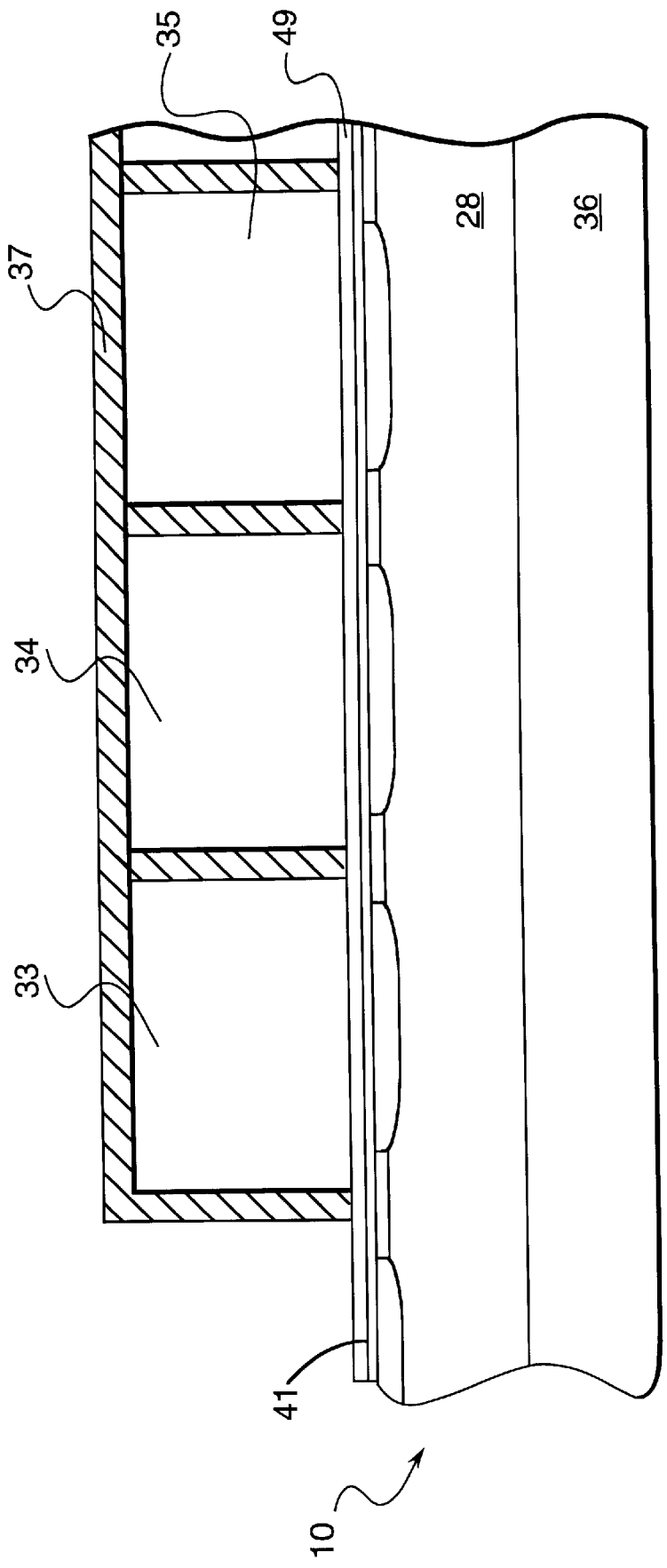
FIG. 2 depicts the imager section of FIG. 1 with a scintillator thereover.

FIG. 2 is a further cross-sectional view of section 10 from FIG. 1 with scintillator segments 33, 34 and 35 thereover. In one embodiment of the present invention, imager section 10 is part of a radiation imager and the radiation-sensitive imaging devices are photodiodes. The scintillator is adapted to emit optical photons in response to the absorption of incident radiation of the type to be imaged, and in a CT system embodiment, typically has a thickness of about 3 mm. Common scintillating materials comprise $(Y_yGd,O)$: Ce, CdWO$_4$, cesium iodide (CSI) and the like. Each of the imaging regions 16, 18 and 20 includes thereover a scintillator block (33, 34 and 35, respectively). Each scintillator block is typically surrounded on all but the exit side by a reflector 37 for keeping light within an imaging region. The reflector material can be metal or white power (e.g., TiO$_2$) in a matrix of plastic, epoxy or adhesive. Alternatively, the reflector material can be a layered composite of metal, plastic and white pigment. The emitted visible light impinges on photodiodes 16, 18 and 20. The impingement of the light results in currents that are integrated in time and periodically read and interpreted as digital data. One skilled in the art will understand that between scintillators 33, 34 and 35, and photodiodes 16, 18 and 20, there may be additional layers not shown here for reasons of simplicity. For example, a layer 49, such as a moisture barrier layer (e.g., silicon nitride or phosphorous-doped silicon dioxide) or an optical coupling adhesive may be interposed.

Returning now to FIG. 1, semiconductor layer 36 is more heavily doped than layer 28 and preferably of the same conductivity type as layer 28. Layer 36 is preferably N+, with doping on the order of about $10^{18}$ to about $10^{21}$#/cm$^3$, while layer 28 is lightly doped N− on the order of about $10^{12}$ to about $10^{17}$#/cm$^3$. The function of the heavily doped layer is to reflect back minority carriers generated from exposure to light for collection by the radiation-sensitive imaging devices, and to suppress the generation of leakage currents from outside the depletion region of layer 28 (this is the so-called "diffusion leakage current").

Preferably, the lateral dimensions (e.g., the horizontal extent of the region denoted by numeral 5 in FIG. 1) of imaging regions 16, 18 and 20 are comparable to or larger than thickness 32 of layer 28 in FIG. 1. This prevents lateral diffusion of the radiation-generated minority carriers from one imaging region reaching an adjacent imaging region and thus producing cross-talk. Also, to help minimize loss of signal carriers generated by scintillator 34 (see FIG. 2) to guard device 14, thickness 32 is preferably small (e.g., on the order of about 10 to about 90 microns) relative to distances 38 (e.g., about 75 microns) and 40 (e.g., about 100 microns). Distance 38 is the distance from the farthest point of edge 12 to an inner edge of guard region 14, and distance 40 is the distance between the inner edge of the guard region and the nearest imaging region (here, region 16).

Figure 3:
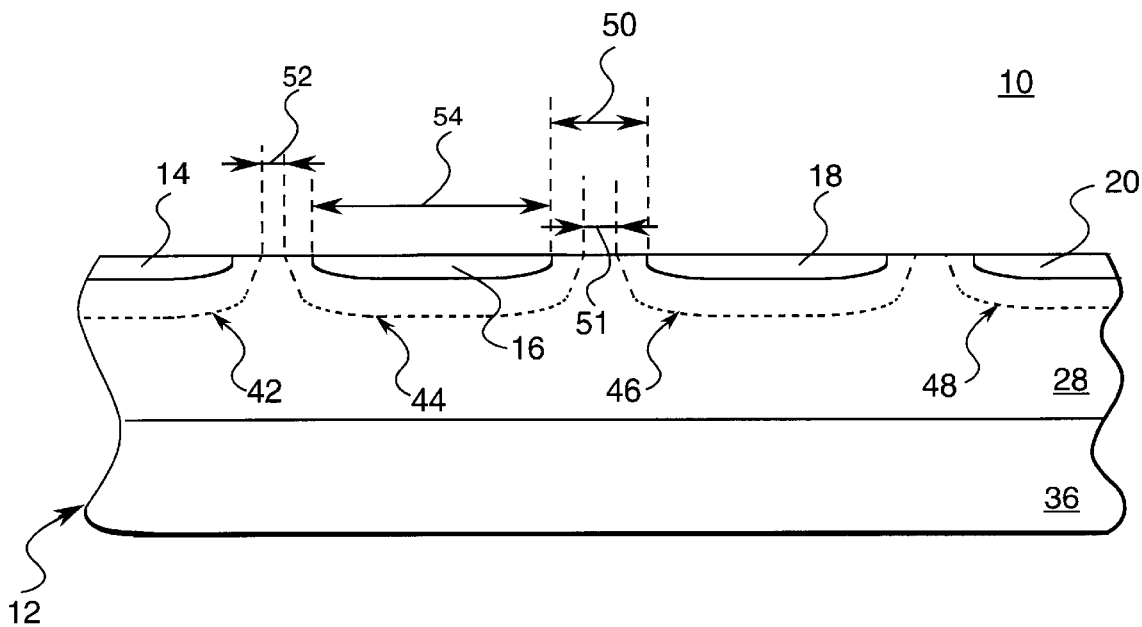
FIG. 3 is a partial view of the imager section of FIG. 1 showing various dimensions.

FIG. 3 depicts part of section 10 from FIG. 1 without optional reflecting regions 22, 24 or 26, in order to more clearly show various dimensions and depletion regions. Regarding depletion regions 42, 44, 46 and 48, the depth and lateral extent of each (as measured from the boundary of the doped region comprising the diode device, e.g. 16,18, and 2) is about 1 to about 25 microns. This distance depends on the doping level of layer 28 and the reverse bias voltage. The distance between adjacent imaging regions (e.g., distance 50) for the radiation-sensitive imaging devices is about 200 microns, and the distance between adjacent depletion regions (e.g., distance 51) is about 150 microns. The distance 52 between depletion region 42 for guard region 14 and that for the immediately adjacent imaging region (i.e., depletion region 44) is about 75 microns. The width of each of the imaging regions is about 700 microns (e.g., width 54 of imaging region 16).

Figure 4:
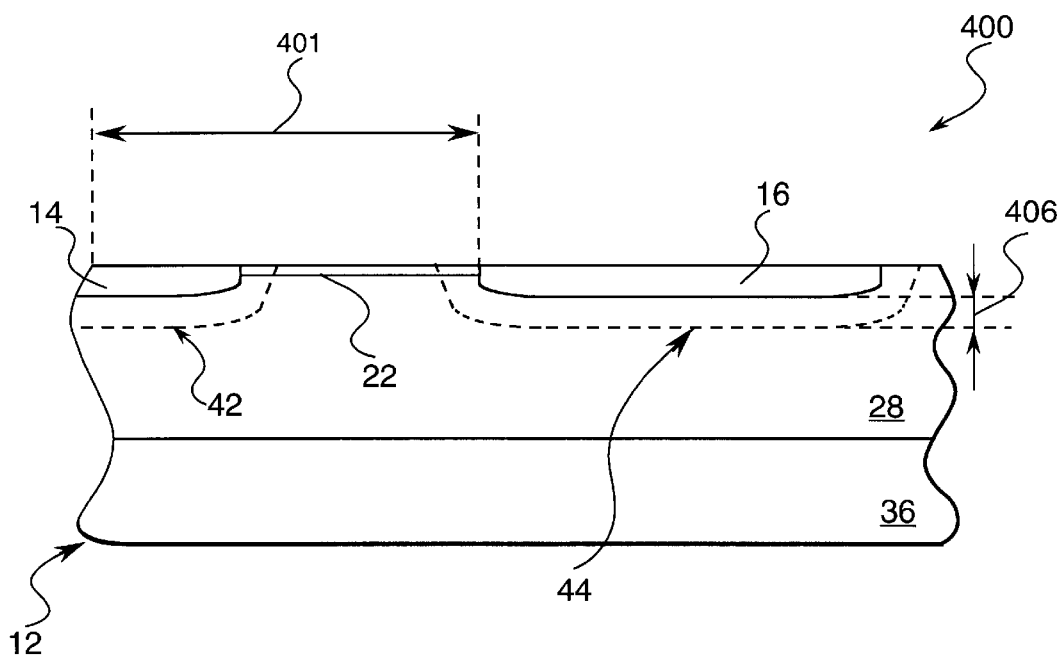
FIG. 4 is an enlarged view of a portion of the imager section of FIG. 1.

FIG. 4 is an enlarged view of a portion 400 of section 10 of FIG. 3 near edge 12. Portion 400 focuses on guard region 14 and the first imaging region 16 adjacent thereto. Distance 401 is the distance between cut edge 12 and the closest imaging region (here, region 16). As one skilled in the art will know, where the guard device is a diode and the first radiation-sensitive imaging device is a photodiode, each will have associated therewith respective depletion regions 42 and 44, as described with respect to FIG. 3. The capacitance of the photodiode 16, which causes increased noise in the readout circuit (not shown), is inversely proportional to a depth 406 of depletion region 44. Thus, from a noise reduction design standpoint, it is desirable to reduce capacitance by increasing the depth of the respective depletion regions for the photodiodes. However, distance 401 between the cut edge and the photodiodes is only about 100 microns and the depletion regions cannot be so large as to overlap with the guard diode 14, which could lead to the guard diode "stealing" charge from the photodiode. However, note that the width of adjacent imaging regions may not be the same.

Secondary issues with regard to leakage current from the cut edge include the distance of the imaging regions (e.g. photodiodes 16, 18, etc.) from cut edge 12 and the thickness 28 of the active region. Typical photodiode placement begins on the order of 0.1 mm from the cut edge (distance 401 in FIG. 4), while the dimensions of photodiodes, for example, are on the order of 0.8 mm across and spaced apart by about 0.2 mm. The closer the imaging regions are to the cut edge, the greater the amount of leakage current reaching the imaging regions. Without guard region 14, this leakage current will be approximately inversely proportional to the distance 401 between the edge of region 16 and cut edge 12. The guard region provides the preferential sink for the leakage current, due to its proximity to the edge, thus significantly reducing the leakage current to imaging region 16. Also, the thicker the substrate area of the active region (e.g., especially layer 28 in FIG. 1), the more leakage current there will be, since the cut edge will be longer. While thickness of the substrate layer 28 may be bad for leakage current, it is desirable to maintain the thickness for increasing diode gain (since more light is absorbed in the active region) and for reducing the thermal coefficient of gain (since the amount of absorbed light does not depend on the temperature). In addition, if lightly-doped semiconductor layer 28 is thicker than 50 microns, it is less expensive to manufacture and of higher electrical quality.

Figure 5:
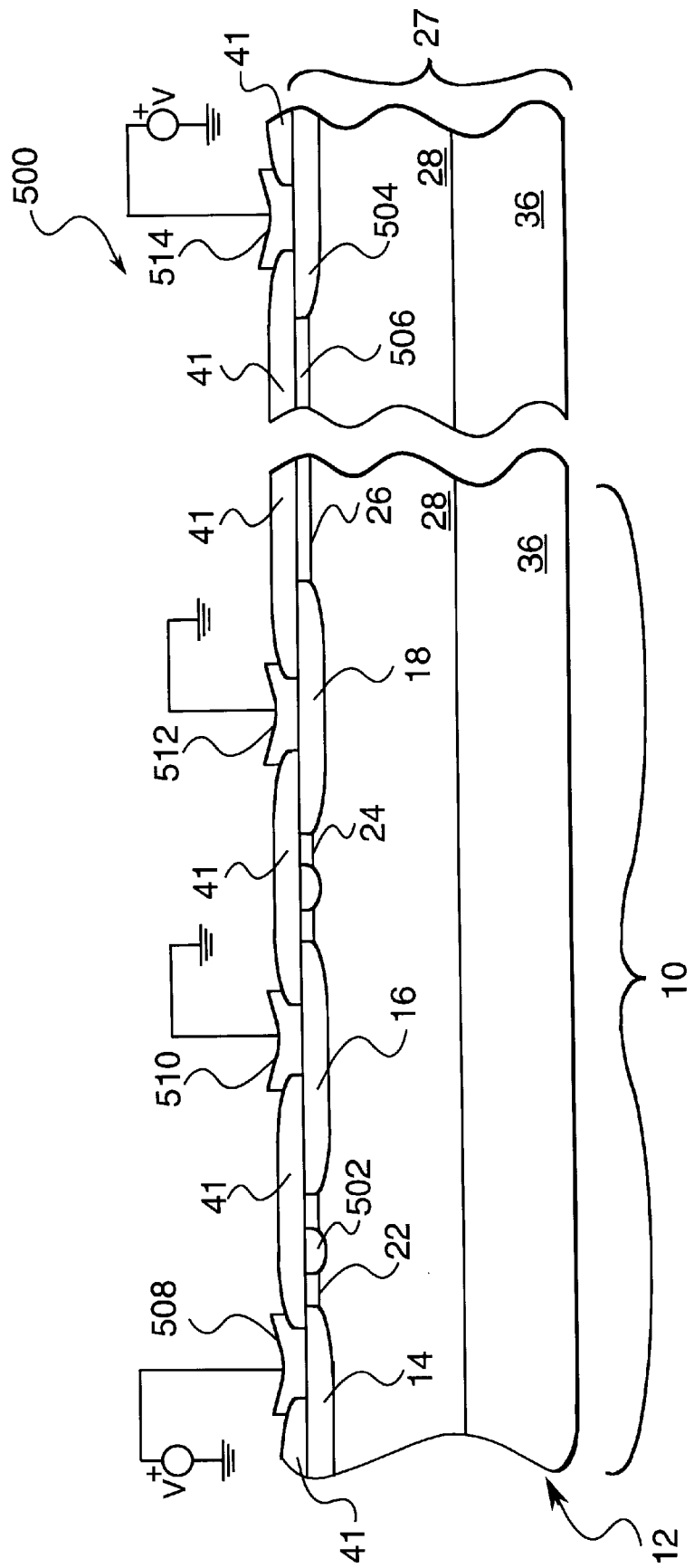
FIG. 5 is a cross-sectional view of the imager section of FIG. 1 with electrical contacts for reverse bias application.

FIG. 5 is a cross-sectional view of section 500 of the exemplary semiconductor chip as FIG. 1, including portion 10, and associated electrical coupling connections. In addition, reflecting regions 22 and 24 are shown with the optional N+ portions (e.g., portion 502) described previously. Two alternative examples for providing the reverse bias for the guard device and the imaging devices relative to substrate 27 will now be given with respect to FIG. 5.

In one example, a heavily doped N+ region 504 is provided in one or more regions of the device. Preferably, a bias contact region 504 is doped at about $10^{18}$ to about $10^{21}$#/cm$^3$. Bias contact region 504 is doped opposite that of guard region 14 and imaging regions 16 and 18. Electrical contacts 508, 510, 512 and 514 comprise, for example, aluminum, and provide electrical coupling to guard region 14, imaging regions 16 and 18, and region 504, respectively. In this example, contact 514 acts as a cathode contact, coupled to a positive voltage source of about 10 volts. Contact 508 acts as an anode contact coupled to a negative voltage source of about −10 volts, while the contacts coupled to the imaging regions (here, 510 and 512) are kept at electrical ground. Optionally, guard diode contact 508 can be connected to electrical ground.

In another example of reverse biasing, region 504 is not present. Substrate 27 is electrically grounded, while a negative voltage (e.g., −10 volts) is applied to the guard diode and imaging region photodiodes through contact means as described above.

One silicon-based example of fabricating portion 500 will now be provided. Silicon substrate 27 comprises a lightly doped N− layer (layer 28) with a deep N+ diffusion layer (36). This substrate can be produced by, for example, phosphorous diffusion from a gas source at high temperature. One side of the wafer is then polished away removing the N+ layer on one side. An oxide layer is grown by, for example, exposing the wafer to oxygen at high temperature or deposited using standard methods. Photo resist masking followed by etching may be used to produce a pattern corresponding to the desired location for the N+ (502) regions. Ion implantation or diffusion is used to produce the N+ regions 502. In one embodiment of the method of the invention, the oxide is then etched off. A new oxide is grown or deposited over the entire wafer surface and patterned. This oxide is patterned as before, exposing the desired P+ regions (14, 16, 18). Ion implantation or diffusion is used to produce the P+ regions. Another oxide is grown or deposited and patterned as before. This etching step produces vias above the P+ and N+ regions as desired for electrical contact. Contact metal is deposited, patterned and etched resulting is the desired contact structures (508, 510, 512 and 514) for reverse biasing the diodes and guard devices. The N− regions (22, 24, 26, 506) shown in FIG. 5 are typically produced by a ion implantation during a step in the process where the silicon is exposed. A suitable point in the process is the first step prior to the first oxide layer or after removal of the oxide layer after production of the N+ (502) regions.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A radiation imaging apparatus, comprising:
    a substrate;
    at least one radiation-sensitive imaging region in the substrate;
    a guard region at or immediately adjacent a cut edge of the substrate, wherein the guard region reduces leakage current reaching the at least one radiation-sensitive imaging region from the cut edge when the imaging apparatus is in use; and
    wherein the at least one radiation-sensitive imaging region and the guard region are electrically reverse biased with respect to the substrate.

2. The imaging apparatus of claim 1, wherein the substrate comprises a first layer of doped semiconductor material and a second layer of semiconductor material lightly doped relative to the first layer.

3. The imaging apparatus of claim 1, wherein the at least one radiation-sensitive imaging region defines an active region of the imaging apparatus, and wherein the guard region extends along a lateral dimension of the active region.

4. The imaging apparatus of claim 3, wherein the guard region extends along a periphery of the active region on each side of the active region that is adjacent a cut edge of the substrate.

5. The imaging apparatus of claim 1, wherein the substrate comprises a semiconductor substrate, and wherein the at least one radiation-sensitive imaging region together with the semiconductor substrate comprises at least one diode.

6. The imaging apparatus of claim 1, wherein the substrate comprises a semiconductor substrate, and wherein the guard region together with the semiconductor substrate comprises a diode.

7. The imaging apparatus of claim 1, wherein the at least one radiation-sensitive imaging region and the guard region are the same doping type.

8. The imaging apparatus of claim 1, wherein the substrate comprises a first layer of doped semiconductor material and a second layer of semiconductor material lightly doped relative to the first layer, and wherein a thickness of the second layer is smaller than each of a width of the guard region and a distance between the guard region and a closest radiation-sensitive imaging region from the cut edge.

9. The imaging apparatus of claim 1, wherein the at least one radiation-sensitive imaging region comprises a plurality of radiation-sensitive imaging regions of a first conductivity type, wherein the substrate is of a second conductivity type opposite the first conductivity type, and further comprising a plurality of reflecting regions disposed in said substrate between immediately adjacent radiation-sensitive imaging regions, said reflecting regions comprising the second conductivity type.

10. The imaging apparatus of claim 9, wherein the first conductivity type is P type, and wherein the second conductivity type is N type.

11. The imaging apparatus of claim 1, wherein the substrate comprises a first layer of doped semiconductor material and a second layer of semiconductor material lightly doped relative to the first layer, and wherein a lateral dimension of each of the at least one radiation-sensitive imaging region is larger than or approximately equal to a thickness of the second layer.

12. An imager, comprising:
    a semiconductor substrate;
    a plurality of light-sensitive imaging regions in the semiconductor substrate, wherein the plurality of light-sensitive imaging regions and semiconductor substrate together comprise a plurality of light-sensitive imaging devices;
    a guard region in the substrate at or immediately adjacent a cut edge of the substrate, wherein the guard region reduces leakage current reaching the plurality of light-sensitive imaging regions from the cut edge when the imager is in use, and wherein the guard region and semiconductor substrate together comprise a guard device; and
    a plurality of electrical contacts for providing reverse electrical biases to the plurality of light-sensitive imaging devices and the guard device.

13. The imager of claim 12, wherein the plurality of light-sensitive imaging regions together with the substrate comprise a plurality of photodiodes, and wherein the guard region together with the substrate comprises a guard diode.

14. The imager of claim 13, wherein the plurality of photodiodes and the guard diode comprise semiconductor material doped to be a first conductivity type.

15. The imager of claim 14, wherein the first conductivity type is P type.

16. The imager of claim 14, wherein a reflecting region of the semiconductor substrate surrounding each of the plurality of light-sensitive imaging regions comprises semiconductor material doped to be a second conductivity type.

17. The imager of claim 16, wherein the first semiconductor type is P type, and wherein the second conductivity type is N type.

18. The imager of claim 13, wherein the plurality of light-sensitive imaging regions define an active region of the imager, and wherein the guard region extends along a lateral dimension of the active region.

19. The imager of claim 18, wherein the guard diode extends along a periphery of the active region for each side of the active region adjacent a cut edge of the substrate.

20. A method of reducing leakage current in an imaging apparatus, including:
    providing a substrate with at least one radiation-sensitive imaging region therein;
    forming a guard region in the substrate at or immediately adjacent a cut edge of the substrate to reduce leakage current reaching the at least one radiation-sensitive imaging region from the cut edge when the imaging apparatus is in use; and
    electrically reverse biasing the at least one radiation-sensitive imaging region and the guard region relative to the substrate.

21. The method of claim 20, wherein electrically reverse biasing comprises forming a plurality of electrical contacts electrically coupled to the at least one radiation-sensitive imaging region and the guard region.

22. The method of claim 20, wherein the at least one radiation-sensitive imaging region defines an active region of the imaging apparatus, and wherein forming the guard region includes forming the guard region to extend along a lateral dimension of the active region.

23. The method of claim 22, wherein the forming comprises forming the guard region to extend along a periphery of the active region on each side of the active region that is adjacent a cut edge of the substrate.

24. The method of claim 20, wherein the substrate comprises a first layer of doped semiconductor material and a second layer of semiconductor material lightly doped relative to the first layer, and wherein forming the guard region comprises sizing and locating the guard region such that a thickness of the second layer is smaller than or comparable to each of a width of the guard region and a distance between the guard region and a closest radiation-sensitive imaging region from the cut edge.

25. The method of claim 20, wherein the substrate comprises a first layer of doped semiconductor material and a second layer of semiconductor material lightly doped relative to the first layer, and wherein a lateral dimension of each of the at least one radiation-sensitive imaging region is larger than or approximately equal to a thickness of the second layer.

26. The method of claim 20, wherein providing the substrate comprises providing a substrate with at least one radiation-sensitive imaging region of a first conductivity type, and wherein the substrate comprises reflecting regions of a second conductivity type opposite the first conductivity type adjacent the at least one radiation-sensitive imaging region.

27. The method of claim 20, wherein providing the substrate comprises providing a substrate with at least one light-sensitive imaging region therein, and wherein forming the guard region comprises forming a diode.

28. A method of fabricating an imager, including:
   providing a semiconductor substrate with a plurality of light-sensitive imaging regions therein, wherein the semiconductor substrate and the plurality of light-sensitive imaging regions together comprise a plurality of photodiodes;
   forming a guard region in the substrate at or immediately adjacent a cut edge of the substrate to reduce leakage current reaching the plurality of photodiodes from the cut edge when the imager is in use, wherein the semiconductor substrate and guard region together comprise a guard diode; and
   forming a plurality of electrical contacts for providing a reverse electrical bias to the plurality of photodiodes and the guard diode.

29. The method of claim 28, wherein the forming comprises electrically coupling the plurality of electrical contacts to the plurality of photodiodes and the guard diode.

30. The method of claim 28, further comprising reverse biasing the plurality of photodiodes and the guard diode relative to the semiconductor substrate.

31. The method of claim 28, wherein the plurality of photodiodes define an active region of the imager, and wherein forming the guard region includes forming the guard region to extend along a lateral dimension of the active region.

32. The method of claim 31, wherein forming the guard region comprises forming the guard region to extend along a periphery of the active region on each side of the active region that is adjacent a cut edge of the substrate.

33. The method of claim 28, wherein the substrate comprises a first layer of doped semiconductor material and a second layer of semiconductor material lightly doped relative to the first layer, and wherein forming the guard region comprises sizing and locating the guard region such that a thickness of the second layer is smaller than or comparable to each of a width of the guard region and a distance between the guard region and a closest light-sensitive imaging region from the cut edge.

34. The method of claim 28, wherein the substrate comprises a first layer of doped semiconductor material and a second layer of semiconductor material lightly doped relative to the first layer, and wherein a lateral dimension of each of the plurality of light-sensitive imaging regions is larger than or approximately equal to a thickness of the second layer.

35. The method of claim 28, wherein providing the semiconductor substrate comprises providing a semiconductor substrate with a plurality of light-sensitive imaging regions of a first conductivity type, and wherein the semiconductor substrate comprises reflecting regions of a second conductivity type opposite the first conductivity type between adjacent light-sensitive imaging regions.

* * * * *